(12) United States Patent
Willmeroth et al.

(10) Patent No.: US 7,825,467 B2
(45) Date of Patent: Nov. 2, 2010

(54) SEMICONDUCTOR COMPONENT HAVING A DRIFT ZONE AND A DRIFT CONTROL ZONE

(75) Inventors: Armin Willmeroth, Augsburg (DE); Anton Mauder, Kolbermoor (DE); Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 149 days.

(21) Appl. No.: 12/241,808

(22) Filed: Sep. 30, 2008

(65) Prior Publication Data

US 2010/0078694 A1 Apr. 1, 2010

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .................. 257/341; 257/328; 257/339; 257/340; 257/367; 257/401; 257/409; 257/E29.013; 257/E29.029; 257/E29.256; 257/E29.325; 257/E29.327

(58) Field of Classification Search .................. 257/328, 257/339–341, 367, 401, 409, E29.013, E29.029, 257/E29.256, E29.325, E29.327
See application file for complete search history.

(56) References Cited

U.S. PATENT DOCUMENTS

| | | | |
|---|---|---|---|
| 4,663,547 A | 5/1987 | Baliga et al. | |
| 6,998,678 B2* | 2/2006 | Werner et al. | 257/334 |
| 7,674,678 B2* | 3/2010 | Hiller et al. | 438/259 |
| 7,679,146 B2* | 3/2010 | Tu et al. | 257/401 |
| 2004/0099905 A1 | 5/2004 | Baliga | 257/328 |
| 2005/0082591 A1* | 4/2005 | Hirler et al. | 257/302 |
| 2007/0200183 A1* | 8/2007 | Rueb et al. | 257/401 |
| 2009/0057713 A1* | 3/2009 | Hirler | 257/143 |
| 2009/0152667 A1* | 6/2009 | Rieger et al. | 257/488 |
| 2009/0218618 A1* | 9/2009 | Blank et al. | 257/331 |
| 2009/0278198 A1* | 11/2009 | Cao et al. | 257/330 |
| 2010/0044720 A1* | 2/2010 | Siemieniec et al. | 257/77 |
| 2010/0052044 A1* | 3/2010 | Hirler | 257/328 |
| 2010/0055892 A1* | 3/2010 | Poelzl | 438/595 |

* cited by examiner

*Primary Examiner*—Ida M Soward
(74) *Attorney, Agent, or Firm*—Dicke, Billig & Czaja, PLLC

(57) ABSTRACT

A description is given of a normally on semiconductor component having a drift zone, a drift control zone and a drift control zone dielectric arranged between the drift zone and the drift control zone.

20 Claims, 8 Drawing Sheets

A-A

SEMICONDUCTOR COMPONENT HAVING A DRIFT ZONE AND A DRIFT CONTROL ZONE

BACKGROUND

One aspect in the development of power transistors is to reduce the specific on resistance $R_{on} \cdot A$, where $R_{on}$ denotes the on resistance of the component and A denotes the chip area required for realizing the component. One concept for reducing the on resistance of a power transistor includes providing a drift control zone in addition to a gate electrode that serves for controlling a conducting channel in a body zone. The drift control zone is arranged adjacent to a drift zone, is dielectrically insulated from the drift zone by a drift control zone dielectric and serves for controlling a conducting channel in the drift zone along the drift control zone dielectric. The conducting channel brings about a significant reduction of the on resistance of the component in comparison with components without such a drift control zone.

SUMMARY

One embodiment relates to a normally on semiconductor component, including: a source zone and a drain zone of a first conduction type and a drift zone of the first conduction type, the drift zone being arranged between the source zone and the drain zone and being doped more weakly than the source zone and the drain zone; a drift control zone, which extends adjacent to the drift zone along the drift zone and which has a source-side end and a drain-side end, wherein the source-side end is connected to a drift control zone terminal; a drift control zone dielectric arranged between the drift control zone and the drift zone; a rectifier arrangement, which is connected between the drift control zone and the drain zone.

One embodiment relates to a semiconductor component arrangement having a normally on semiconductor component and a normally off semiconductor component. The normally on semiconductor component of this semiconductor component arrangement includes: a source zone and a drain zone of a first conduction type and a drift zone of the first conduction type, the drift zone being arranged between the source zone and the drain zone and being doped more weakly than the source zone and the drain zone; a drift control zone, which extends adjacent to the drift zone along the drift zone and which has a source-side end and a drain-side end, wherein the source-side end is connected to a drift control zone terminal; a drift control zone dielectric arranged between the drift control zone and the drift zone; a rectifier arrangement, which is connected between the drift control zone and the drain zone. The normally off semiconductor component of this semiconductor component arrangement includes a drive terminal and a load path, the load path of which is connected in series with the drift zone of the normally on semiconductor component and the drive terminal of which is coupled to the drift control zone terminal of the normally on semiconductor component.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
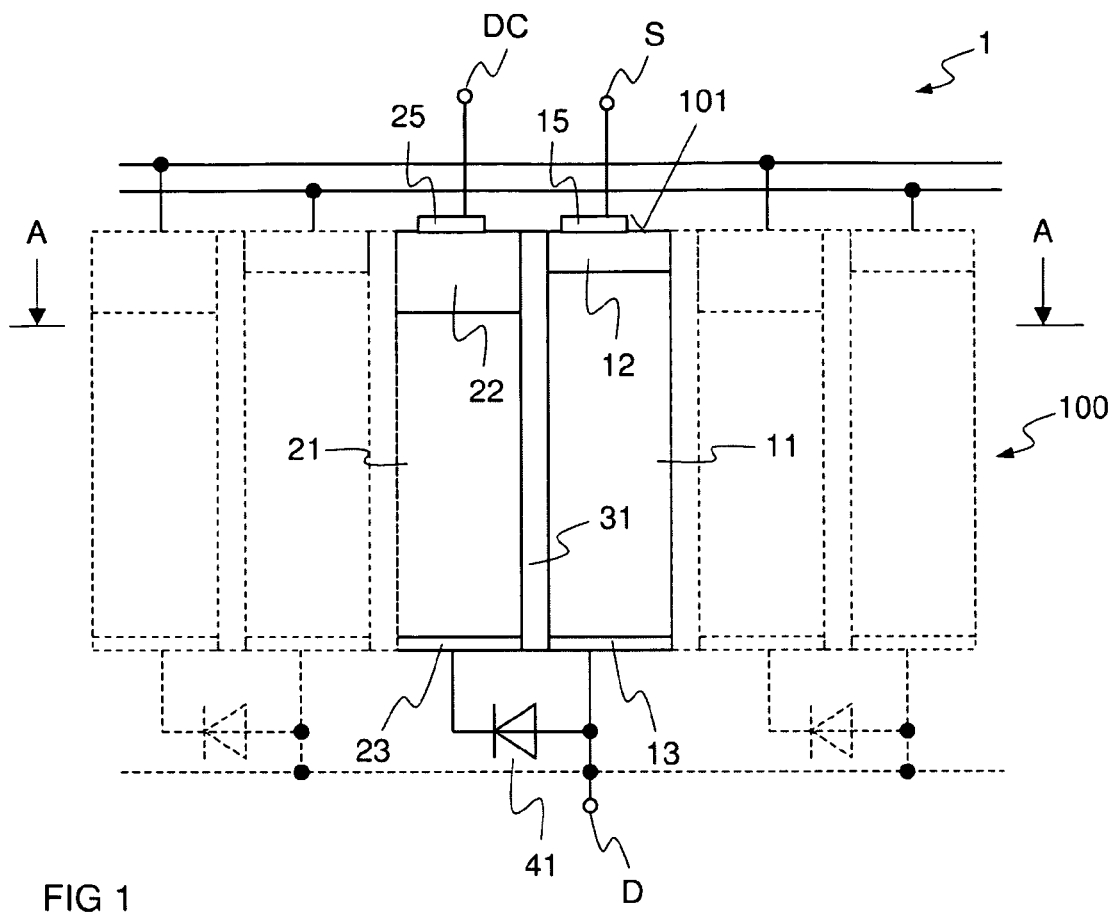
FIG. 1 illustrates one embodiment of a normally on semiconductor component including a drift zone and a drift control zone, on the basis of a vertical cross section through a semiconductor body.

FIG. 1 illustrates one embodiment of a normally on semiconductor component. This component includes a semiconductor body 100 having two sides remote from one another, these sides also being designated hereinafter as front and rear sides of the semiconductor body 100. FIG. 1 illustrates a vertical cross section of the semiconductor body 100, that is to say a cross section in a sectional plane running perpendicular to the front and rear sides. The semiconductor body 100 is composed of silicon, for example.

The semiconductor component includes a source zone 12 and a drain zone 13 of a first conduction type and a drift zone 11 of the first conduction type, the drift zone being arranged between the source zone 12 and the drain zone 13 and being doped more lightly than the source zone 12 and the drain zone 13. The doping concentrations of the source zone 12 and of the drain zone 13 lie, for example, within the range of between $1 \cdot 10^{17}$ cm$^{-3}$ and $1 \cdot 10^{20}$ cm$^{-3}$, the doping concentration of the drift zone 11 lies, for example, within the range of between $1 \cdot 10^{12}$ cm$^{-3}$ and $1.10^{16}$ cm$^{-3}$. In the case of this component, a direction in which the source zone 12 and the drain zone 13 are arranged at a distance from one another defines a current flow direction. The dimension of the drift zone 11 in this current flow direction is designated hereinafter as the length of the drift zone 11.

Arranged adjacent to the drift zone 11 is a drift control zone 21, which extends at least along part of the length of the drift zone 11 in the current flow direction and which is dielectrically insulated from the drift zone 11 by a drift control zone dielectric 31. The drift control zone 21 can be of the same conduction type as the drift zone 11, but can also be doped complementarily with respect to the drift zone 11. A doping concentration of the drift control zone 21 lies, for example, within the range of the doping concentration of the drift zone 11, and lies in particular within the range of between $1 \cdot 10^{12}$ cm$^{-3}$ and $1 \cdot 10^{16}$ cm$^{-3}$.

The drift control zone 21 has a source-side end and a drain-side end in the current flow direction, wherein the source-side end is arranged in the region of the source zone 12 and the drain-side end is arranged in the region of the drain zone 13. The drift control zone 21 is connected to the drain zone 13 using a rectifier element 41. In the example illustrated, the rectifier element 23 is connected to the drain-side end of the drift control zone 21. The rectifier element 41 is illustrated merely on the basis of its electrical circuit symbol in FIG. 1. The rectifier element 41 can be realized in any desired manner within the same semiconductor body 100 as the drift zone 11 and the drift control zone 21. For this purpose, the semiconductor body 100 can have further semiconductor zones or semiconductor layers that are not illustrated in FIG. 1. However, the rectifier element 41 can also be realized as an external semiconductor component, that is to say outside the semiconductor body 100 having the drift zone 11 and the drift control zone 21. The rectifier element 41 is connected with polarity such that when the component is in the on state, that is to say during an operating state which will be explained below and in which the drift control zone 21 brings about the formation of a conducting channel in the drift zone 11 along the drift control zone dielectric 31, a discharging of the drift control zone 21 in a direction of the drain zone 13 is prevented.

At its source-side end, the drift control zone 21 is connected by using a first connection zone 22, which is doped complementarily with respect to the drift zone 11, to a drift control terminal DC, which is only illustrated schematically in FIG. 1. At its drain-side end, the drift control zone 21 is connected to the rectifier element 41 by using a second connection zone 23, which is of the same conduction type as the drift control zone 21 but doped more highly than the latter. The second connection zone 23 is optional and essentially serves to bring about an ohmic connection of the rectifier element 41 to the drift control zone 21 if the rectifier element is not realized as an integrated component directly adjacent to the drift control zone 21.

Figure 13:
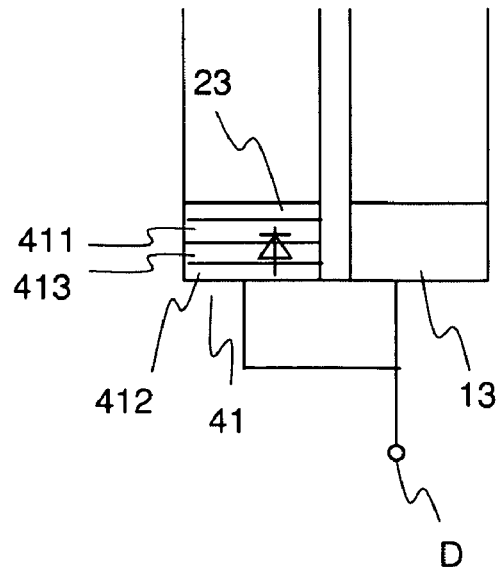
FIG. 13 illustrates a realization of a rectifier element as an integrated component.

FIG. 13 illustrates one embodiment in which the rectifier element is realized as an integrated component in the region of the drain-side end of the drift control zone 21. In order to realize this rectifier element, two semiconductor zones 411, 412 doped complementarily with respect to one another are present, between which a more weakly doped semiconductor zone 413, which forms a base zone, is optionally present. The two complementarily doped zones 411, 412 or the base zone 413 and one of the complementarily doped zones 411 or 412 form a pn junction between the drain zone 13 or the drain terminal D and the drift control zone 21. In the case of such a realization of the rectifier element 41, a first connection zone 21 can likewise be present between the component zones of the rectifier element 41 and the drift control zone 21. In this case, the second connection zone 23 serves as a channel stopper that prevents charge carriers from the drift control zone—i.e. holes in the case of an n-conducting component—from being able to pass into the region of the pn junction.

In the case of the semiconductor component illustrated in FIG. 1, the component zones explained above are arranged in such a way that the current flow direction runs in a vertical direction of the semiconductor body 100, that is to say perpendicular to the front and rear sides. This component geometry should be understood merely as an example. It goes without saying that there is also the possibility of arranging these component zones in such a way that a current flow direction of the component runs in a lateral direction of the semiconductor body 100.

In the case of the component illustrated, the source zone 12 and the first connection zone 22 can be directly adjacent to the front side 101 of the semiconductor body 100. A source terminal S, which makes contact with the source zone 12, and also the drift control zone terminal DC, which makes contact with the first connection zone 22, are formed, for example, by metallizations 15, 25 that are applied to the source zone 12 and the first connection zone 22 in the region of the front side 101. The drain zone 13 and the second connection zone 23 of the drift control zone 21 can be arranged in the region of the rear side of the semiconductor body 100. Between these component zones and the rear side of the semiconductor body, however, even further semiconductor layers can be present (not illustrated), in which the rectifier element 41, for example, is realized. Furthermore, a drain electrode (not illustrated), which makes contact with the drain zone 13, can be present in the region of the rear side.

The semiconductor component can have a multiplicity of component structures of identical type each having a drift zone 11, a source zone 12, a drain zone 13, a drift control zone 21 and a drift control zone dielectric 31 and also a rectifier element 41. These component structures are designated hereinafter as component cells. These individual component cells are connected in parallel by virtue of the source zones 12 of the individual component cells being electrically conductively connected to one another, the drain zones 13 of the individual component cells being electrically conductively connected to one another, and the drift control zone terminals of the individual component cells being electrically conductively connected to one another. Such further component cells are illustrated by dashed lines in FIG. 1.

Figure 2:
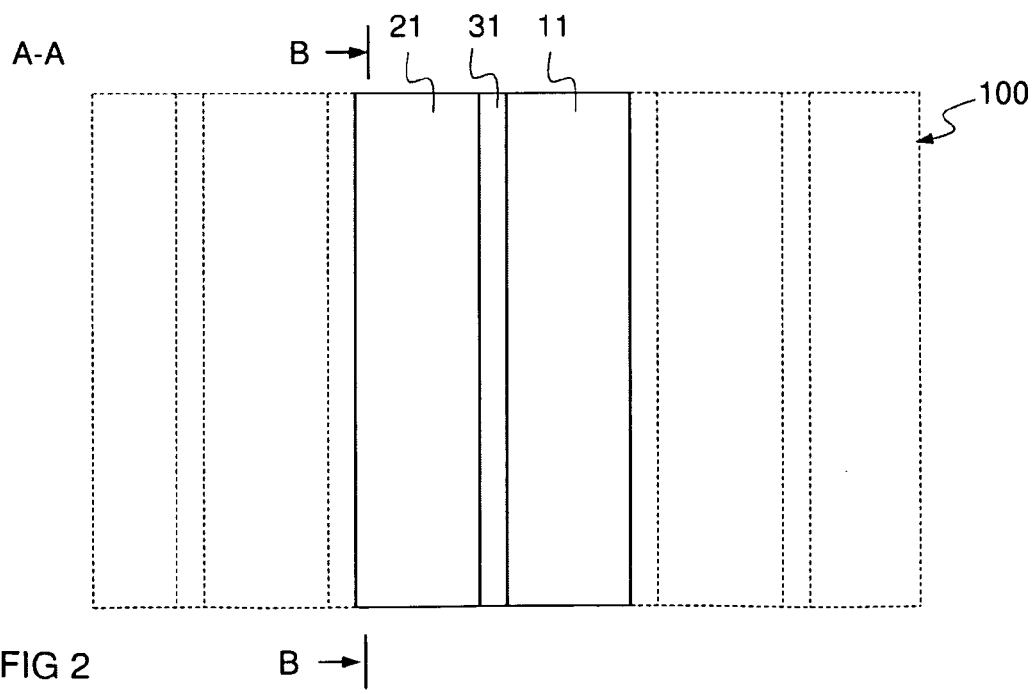
FIG. 2 illustrates one embodiment of a normally on semiconductor component including strip-type drift zones and drift control zones, on the basis of a horizontal cross section through a semiconductor body.

Referring to FIG. 2, which illustrates a cross section through the semiconductor body 100 in a lateral sectional plane A-A illustrated in FIG. 1, the drift zone 11—and correspondingly the source zone 12 and the drain zone 13—the drift control zone 21 and the drift control zone dielectric 31 arranged between the drift zone 11 and the drift control zone 21 can be formed in elongated or strip-type fashion in a lateral direction of the semiconductor body. The component cells each having a drift zone 11 and a drift control zone 21 and also an intervening drift control zone dielectric 31 are "strip cells" in this case.

Figure 3:
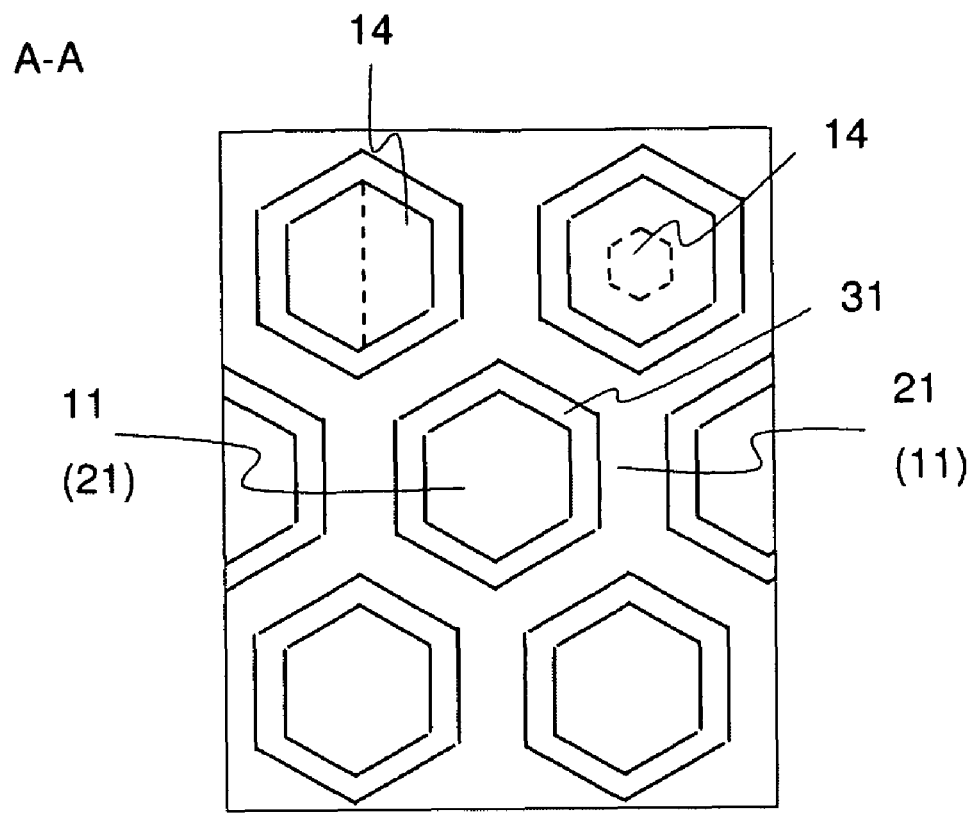
FIG. 3 illustrates one embodiment of a normally on semiconductor component having hexagonal drift zones or hexagonal drift control zones, on the basis of a horizontal cross section through a semiconductor body.

It goes without saying that the drift zone 11 and the drift control zone 21 can also have any other component geometries. FIG. 3 illustrates a horizontal cross section through a semiconductor body 100 of a further semiconductor component. In the case of this semiconductor component, the drift zones 11 have a hexagonal geometry in a horizontal direction and are completely surrounded by the drift control zone dielectric 31 in a horizontal direction, the dielectric having the geometry of a hexagonal ring in this case. In this case of this component, a plurality of such hexagonal drift zones 11 are present, which are arranged at a distance from one another. In this case, the drift control zone 21 is arranged between the individual drift zones 11, has a lattice-shaped geometry and is insulated from the drift zones 11 by the drift control zone dielectrics 31 surrounding the drift zones 11. As an alternative, there is the possibility of realizing the drift control zones 21 as hexagonal component zones. In this case, the drift zone 11 is arranged between the individual hexagonal drift control zones 21 and insulated from the drift control zones 21 by the drift control zone dielectrics 31. The reference symbols indicated between parentheses in FIG. 3 relates to this second variant.

Instead of hexagonal drift zones 11 or drift control zones 21, these component zones can also be realized with any other geometries and can be, for example, rectangular, in particular square, round or arbitrarily polygonal. Positioning of these drift zones 11 and drift control zones 21 may also be different from the illustrated hexagonal grid. These zones may, for example, be positioned in a rectangular, in particular square, or any other grid.

Figure 4:
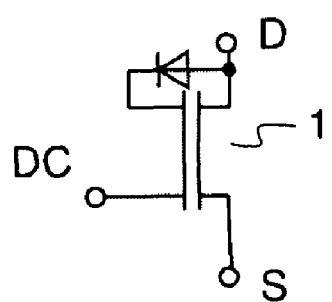
FIG. 4 illustrates one embodiment of an electrical circuit symbol of the normally on semiconductor component.

FIG. 4 illustrates the circuit symbol of the normally on semiconductor component. This circuit symbol is based on the circuit symbol of a normally on MOS transistor and has the source terminal S and the drain terminal D as load path terminals and the drift control zone terminal DC. A load path of this component runs between the drain terminal D and the source terminal S. The rectifier element 41 illustrated in FIG. 1 between the drain terminal D and the drift control zone 21 is likewise illustrated in FIG. 4.

The functioning of this component is explained below. It shall be assumed for the purposes of the explanation below that the component is an n-conducting component. In this case, the drift zone 11 and also the source and drain zones 12, 13 are n-doped semiconductor zones. It goes without saying that the component can also be realized as a p-conducting component. In this case, the drift zone 11 and also the source and drain zones 12, 13 are p-doped semiconductor zones. Moreover, the doping types of the semiconductor zones that will be explained below should be doped complementarily in the case of a p-conducting component. Furthermore, the polarities of the voltages mentioned in the explanation below should be interchanged in the case of a p-conducting component.

As already explained above, the drift control zone 21 serves for controlling a conducting channel in the drift zone 11 along the drift control zone dielectric 31. The component is turned on if a positive voltage is present between the drain terminal D and the source terminal S and if the drift control zone 21, by the application of a suitable electrical potential to the drift control zone terminal DC, is at an electrical potential that is higher or positive with respect to the electrical potential at the drain terminal D. The component is already turned on when the electrical potential at the drift control zone terminal DC corresponds to the source potential, that is to say to the potential at the source terminal S. In this case, however, the potential difference between the electrical potential of the drift zone 11 and that of the drift control zone 21 does not suffice to form an accumulation channel along the drift control dielectric 31 in the drift zone 11, such that the on resistance is higher in this case than in the case explained above, in which an accumulation channel is formed. The drain-side end of the drift control zone 21 is in this case at the electrical potential of the drain terminal D minus the forward resistance of the rectifier element 41. The electrical potential in the drift control zone 21 is approximately constant or approximately follows the electrical potential in the drift zone 11 in the current flow direction, if a space charge zone (depletion zone) has occurred in the drift zone 11.

In the case of an n-conducting component, the drift control zone 21 is an n-doped semiconductor zone, for example. In order to generate a positive electrical potential with respect to the electrical potential of the drift zone 11 on that side of the accumulation dielectric which is situated in the drift control zone 21, and thus in order to form an accumulation channel along the drift control dielectric 31 in the drift zone 11, p-type charge carriers or holes are additionally required in the drift control zone 21 since the positive charge of the donor cores of the drift control zone 21 is not high enough. The holes are provided, for example, from the first connection zone 22, which is doped complementarily with respect to the drift control zone 21 and which is connected between the drift control zone terminal DC and the drift control zone 21. A pn junction formed between the first connection zone 22 and the drift control zone 21 additionally prevents a current flow between the drain terminal D and the drift control zone terminal DC if the electrical potential at the drain terminal D is higher than the electrical potential at the drift control zone terminal DC.

The component is turned off if an electrical potential that lies below the source potential by the value of a depletion voltage is present at the drift control zone terminal DC. The depletion voltage lies, for example, within the range of between 5 V and 10 V. In this case, an accumulation channel possibly present along the drift control zone dielectric 31 is decomposed and the drift zone 11, in a region adjacent to the source zone 12, is depleted in a lateral direction proceeding from the drift control zone dielectric 31, whereby a conductive connection between the source zone 12 and the drain zone 13 is interrupted. This interruption takes place at potentials at the drift control zone terminal DC which lie below the abovementioned depletion voltage for about the value of the drain-source-voltage that is currently present. In the current flow direction, this depleted region of the drift zone 11 expands all be further in a direction of the drain zone 13, the higher a positive voltage present between drain D and source S. The depleted region takes up the voltage present between drain D and source S, the electrical potential increasing within the depleted region in a direction of the drain zone 13. The depletion of a section of the drift zone 11 which extends at least over part of the length of the drift zone 11, or the presence of the drain-source voltage across the depleted region is tantamount to the formation of a space charge zone in the depleted region of the drift zone 11. When the component is turned off, a space charge zone also forms in the drift control zone 21, to be precise proceeding from the pn junction between the drift control zone 21 and the first connection zone 22. The space charge zone propagating in the drift control zone 21 controls—assuming that the electrical potential at the drift control zone connection is predetermined—the propagation of the space charge zone in the drift zone 11.

The pn junction between the drift control zone 21 and the first connection zone 22 is reverse-biased if the drain potential, that is to say the potential at the drain terminal D, is higher than the electrical potential at the drift control zone terminal DC. This is the case whenever a positive voltage is present between drain D and source S and the electrical potential at the drift control zone terminal DC is less than the electrical potential at the source terminal S. The drift control zone 21 and the drift zone 11 are realized in a suitable manner such that a space charge zone can form. For this purpose, the drift zone 11 and the drift control zone 21 are composed, for example, of a monocrystalline or an at least approximately monocrystalline semiconductor material and, taking account of the length of the drift zone 11 and the drift control zone 21, have a sufficiently low doping, such that the space charge zone can propagate over large sections, that is to say over at least 50% or at least 80% of the length of the drift zone 11 in the drift control zone 21 before the dielectric strength of the component is reached. It goes without saying that the dimensions of the drift control zone 21—and thus also of the drift zone 11—can be chosen such that the space charge zone expands to a lesser extent than over the abovementioned 50% of 80% of the length. This results in a higher on resistance, however.

The space charge zones propagating approximately uniformly in the drift zone 11 and the drift control zone 21 when the component is turned off limit the electrical voltages present across the drift control zone dielectric 31. In this case, the maximum voltage difference occurs at the source-side end of the drift zone 21 and corresponds to the potential difference between the electrical potential at the source terminal S and the electrical potential at the drift control zone terminal DC. The voltage difference is dependent on the dielectric strength of the component and lies, for example, within the range of 10 to 15 V given a dielectric strength of a few 100 V, such as e.g., 600 V. The voltage difference is correspondingly smaller in the case of components having a lower dielectric strength. The drift zone 11 is therefore dimensioned in such a way that a voltage of a few hundred V can be present across the drift zone 11 when the component is turned off. With regard to its dielectric strength, the drift control zone dielectric 31 only has to be dimensioned such that it withstands the difference voltage between drift control zone terminal DC and source terminal S. On account of this comparatively low dielectric strength of the drift control zone dielectric 31, the drift control zone dielectric 31 can be made comparatively thin. As a result of this, a comparatively small potential difference between the electrical potential of the drift zone and the electrical potential of the drift control zone 21 suffices in order to form a conducting channel along the drift control zone dielectric 31 in the drift zone 11.

In the case of the component illustrated, driving in the on state and in the off state is effected exclusively via the drift control zone 21 and the drift control zone terminal DC. In comparison with components which additionally have a gate electrode, this component can be realized more simply and thus more cost-effectively.

Referring to FIG. 1, the first connection zone 22 is realized in particular in such a way that it partly overlaps the drift zone 11, that is to say, relative to the example illustrated in FIG. 1, that the first connection zone, proceeding from the first side 101, extends into the semiconductor body 100 further than the source zone 12 and is thereby arranged adjacent to sections of the drift zone 11 across the drift control zone dielectric 31. This prevents a situation in which, when the component is turned off, under the control of the electrical potential of the source zone 12, a conducting channel forms over the entire length of the first connection zone 22 between the drift control zone 21 and the drift control zone terminal DC. Such a conducting channel would render ineffective the pn junction—which effects blocking when the component is turned off—between the first connection zone 22 and the drift control zone 21. The overlap between the first connection zone 22 higher than the drift control zone 21 and a section of the drift zone 11 which is situated below the source zone additionally enables this section of the drift zone 11 to be depleted upon application of a suitable depletion potential to the drift control zone terminal DC. In this case, the more highly doped first connection zone remains at this electrical potential. In this case, the doping concentration of the first connection zone 22 is so high that the latter cannot be fully depleted either in a lateral direction or in a vertical direction.

Figure 5:
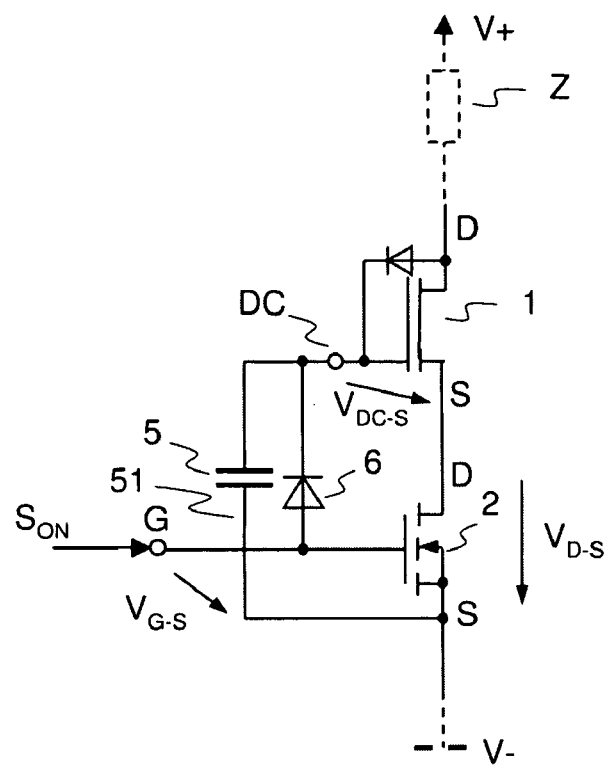
FIG. 5 illustrates one embodiment of a semiconductor component arrangement including a normally on and a normally off semiconductor component, on the basis of an electrical equivalent circuit diagram.

FIG. 5 illustrates, on the basis of an electrical equivalent circuit diagram, an application of the normally on semiconductor component 1 explained above in a circuit arrangement for switching an electrical load Z. In addition to the normally on semiconductor component 1, the circuit arrangement includes a normally off semiconductor component 2, which is embodied as a normally off MOS transistor in the example illustrated. This normally off transistor has a gate terminal G as drive terminal and also a load path formed between a drain terminal D and a source terminal S. The normally on semiconductor component 1 and the normally off semiconductor component 2 are part of a cascode circuit in which the load paths of the two components 1, 2 are connected in series with one another. In the case of this circuit arrangement, the normally on semiconductor component 1 is driven via the drive terminal G of the normally off component 2. A drive signal S for driving the normally off component 2, and thus also the normally on component 1, in the on state or in the off state is provided, for example, by a drive circuit (not illustrated in more specific detail). The drift control zone terminal DC is coupled to the drive terminal G of the normally off component 1.

The normally on semiconductor component 1 and the normally off component 2 of this circuit arrangement can be integrated in a common semiconductor body in a manner not illustrated more specifically. However, these semiconductor components can also be integrated in separate semiconductor bodies or chips, such as can be arranged in a common chip housing, for example, using chip-on-chip technology or chip-by-chip technology.

In the embodiment in accordance with FIG. 5, a rectifier element 6, for example, a diode, is connected between the drive terminal G and the drift control zone terminal DC. This rectifier element is optionally present and serves together with a capacitance 5, which is likewise optionally present and which is connected between the drift control zone terminal DC and a terminal for a reference potential, in the example illustrated: the source potential of the normally off component 2, for reducing switching losses, which will be explained below. If the capacitance 5 is dispensed with, then the rectifier element 6 can also be dispensed with. In this case, the drift control zone terminal DC of the normally on component 1 is directly connected to the drive terminal G of the normally off component 2.

In a further embodiment (not illustrated) drift control zone terminal DC is not connected to control terminal G but to a terminal for a fixed potential. The value of this potential may be selected such that in case of a blocking (turned off) component a voltage difference between the drift control zone terminal DC and source terminal S is at least the depletion voltage, i.e. the voltage required for interrupting a conducting channel in drift zone 11. Also in this example the cascade circuit is controlled by the gate terminal of normally on component 2.

The cascode circuit having the normally on and the normally off component 1 serves, for example, for switching an electrical load Z. In this case, the series connection of the load paths of the two components 1 is connected in series with the load Z between terminals for a positive and a negative supply potential V+, V−. In order to afford a better understanding of the functioning of the circuit that is explained below, FIG. 5 likewise illustrates the load Z, which can be any desired electrical load. The circuit arrangement having the two semiconductor components 1, 2 functions as a low-side switch in the example illustrated in FIG. 5. In this case, the circuit arrangement is connected between the load Z and the terminal for the negative supply potential V−. It goes without saying, however, that the circuit arrangement can also be used as a high-side switch and in this case is connected between the terminal for the positive supply potential and the load Z.

The functioning of the circuit arrangements is explained below for the use of the circuit arrangement as a low-side switch as illustrated in FIG. 5. It shall be assumed for this explanation that the normally on component 1—as explained above—is an n-conducting component and that the normally off component 2 is likewise an n-conducting semiconductor component. The normally off semiconductor component 2 is turned on if, under the control of the drive signal $S_{ON}$, the electrical potential at the drive terminal G rises to a value which is higher than the electrical potential at the source terminal S at least by the value of a threshold voltage of the component, that is to say if a gate-source voltage $V_{G-S}$ is higher than the threshold voltage of the component 2. The drive signal $S_{ON}$ is chosen, for example, in such a way that the gate-source voltage lies within the range of 10 V to 15 V. The electrical potential at the drift control zone terminal DC of the normally on component 1 either corresponds to the electrical potential at the drive terminal G of the normally off component 2 or lies below the electrical potential by the value of the forward voltage of the rectifier element 6. If the normally off component 2 is turned on, then the source potential of the normally on component 1 decreases. The gate-source voltage $V_{G-S}$ is chosen in such a way that a load path voltage $V_{D-S}$ of the normally off component 2 is significantly less than the gate-source voltage $V_{G-S}$. The load path voltage $V_{D-S}$ is less than 5 V, for example. As a result, the source potential of the normally on semiconductor component 1 decreases to an extent such that the drift control zone terminal DC is at a positive electrical potential in comparison with the source potential of the normally on component 1. As a result of this, an accumulation channel forms in the normally on component 1—as explained above—along the drift control zone dielectric 31, such that the normally on component 1 is also driven in the on state. For a voltage $V_{DC-S}$ between the drift control zone terminal DC and the source terminal S of the normally on component 1, the following holds true in the example illustrated:

$$V_{DC-s}=V_{G-S}-V_{D-S}-(V_6) \quad (1).$$

In this case, $V_{G-S}$ denotes the gate-source voltage and $V_6$ denotes the forward voltage of the rectifier element 6. This voltage is between parentheses in equation (1) in order to indicate that this voltage should be taken into account only when the rectifier element 6 is also present.

The normally off component 2 is turned off if, owing to the drive signal S, the gate-source voltage $V_{G-S}$ decreases below the value of the threshold voltage or tends toward zero. As a result, firstly the load path voltage $V_{D-S}$ of the normally off component 2 rises. If the rectifier element 6 is present, the electrical potential at the drift control zone terminal DC can still correspond to the previous positive drive potential. As the rise in the load path voltage $V_{D-S}$ increases, however, the voltage between the drift control zone terminal DC and the source terminal S of the normally on component 1 becomes lower and finally becomes negative to such a great extent until the normally on component 1 is completely turned off. If the rectifier element 6 is not present, then the voltage $V_{DC-S}$ becomes zero directly with driving of the normally off component 2 in the off state, and becomes negative when the load path voltage $V_{D-S}$ of the normally off component 2 rises. In the first-mentioned case, the load path voltage $V_{D-S}$ of the normally off component 2 must rise to an extent such that it corresponds to the sum of the drive voltage $V_{DC-S}$ specified in equation (1) and the magnitude of the depletion voltage or negative drive voltage required for driving the normally on component 1 in the off state. The negative voltage between the drift control zone terminal DC and the source terminal S of the normally on component 1 which is required for driving the component 1 in the off state corresponds with regard to its magnitude, for example, to the gate-source voltage $V_{G-S}$ required for driving the normally off component 2 in the on state. The load path voltage $V_{D-S}$ across the normally off component 2 thus rises, for example, approximately by the value of twice the drive voltage $V_{G-S}$ before the normally on component 1 is completely turned off and accepts the rest of the voltage present between the supply potential terminals. The voltage can be up to a few hundred volts or more. By contrast, the dielectric strength of the normally off component 2 must only have a magnitude such that it corresponds—in relation to the example illustrated—to approximately double the drive voltage $V_{G-S}$, that is to say, for example, approximately between 20 and 30 V. If the rectifier element 6 is dispensed with, then the dielectric strength of the blocking component 2 could even be lower and must in this case only correspond approximately to the magnitude of the negative voltage required for driving the normally on component 1 in the off state.

As has already been explained above, the drift control zone of the normally on component 1 is positively charged if the component is an n-conducting component. Charge carriers required for driving the component in the on state for the first time are provided by a drive circuit connected to the drive terminal G of the normally off component 2 in the case of the circuit arrangement illustrated in FIG. 5. With the component driven in the off state, the charge carriers are conducted away from the drift control zone (21 in FIG. 1) via the drift control zone terminal DC. The charge carriers can be buffer-stored in the capacitance 5 optionally present, such that the charge carriers do not have to be made available anew each time the normally on component 1 is switched on again. The switching losses of the circuit arrangement can be kept low as a result of this. The rectifier element 6 optionally present prevents the charge carriers that are conducted away from the drift control zone of the normally on component 1 from flowing away via the drive terminal of the normally off component 2, and thus enables the charge carriers to be buffer-stored in the capacitance 5.

With the component driven in the off state, charge carrier pairs, that is to say electrons and holes, are generated thermally in the drift control zone. The holes can flow away, in the case of an n-doped drift control zone 21 and a p-doped connection zone 22, via the connection zone 22. The electrons can flow away to the drain zone via the rectifier element 41. The rectifier element 41 therefore also prevents electrons from being accumulated in the drift control zone 21 which in the long term can impair the electrical function of the component.

Figure 6:
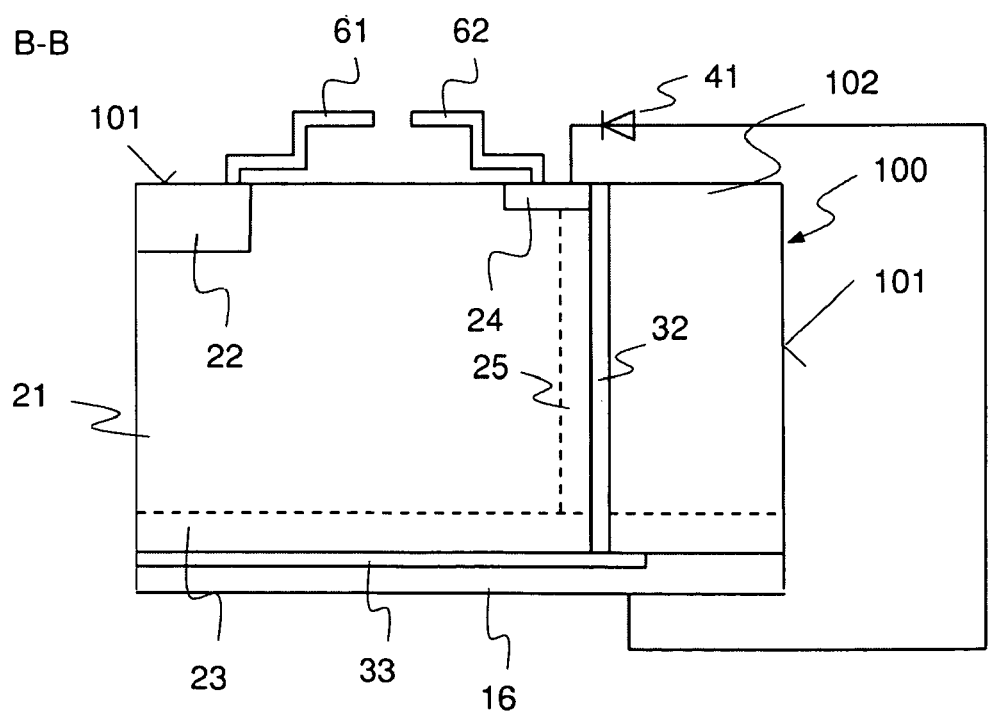
FIG. 6 illustrates one embodiment of a normally on semiconductor component having a strip-type drift control zone.

It should be noted in this context that the rectifier element 41 need not necessarily be connected directly to the drain-side end of the drift control zone 21. FIG. 6 illustrates a cross section through the semiconductor body of a semiconductor component having strip-type drift zones 11 and drift control zones 21, in a sectional plane B-B illustrated in FIG. 2. FIG. 6 illustrates the cross section through the component in an edge region 102 of the semiconductor body. The edge region is a region of the semiconductor body which is adjacent to an edge area 101 in a lateral direction. In this case, the drift control zone 21 is dielectrically insulated from the edge region 102 by using a further dielectric layer 32, which can be realized in a manner corresponding to the drift control zone dielectric. The connection zone 22 ends at a distance from the further dielectric layer in a lateral direction.

The reference symbol 16 in FIG. 6 designates a drain electrode, which is composed, for example, of a metal or a highly doped polycrystalline semiconductor material and which is connected to the drain zones, which cannot be seen in the sectional plane B-B. The rectifier element 41 is connected between the drain electrode 16 and a further connection zone 24 of the drift control zone 21. The further connection zone 24 is arranged at a distance from the connection zone 22 in the region of the front side 101 and is thus situated at a lateral end of the drift control zone or in the region of an end side of the strip-type drift control zone 21. The connection zone 24 can be adjacent to the dielectric layer 32. If the two connection zones 22, 24 are at different electrical potentials, as is the case, for example, when the component is turned off, then a space charge zone propagates in a lateral direction of the drift control zone, the space charge zone taking up this voltage difference.

In the case of the component illustrated, the drift control zone 21 is insulated from the drain electrode 16 by a further dielectric layer 33 at its drain-side end. A semiconductor zone 23 can be provided along the further dielectric layer 33, which semiconductor zone is of the same conduction type as the drift control zone but is doped more highly and has the effect that the drift control zone is at an identical electrical potential at all points at its drain-side end. Optionally, this more highly doped semiconductor zone 23 is connected to the connection zone 24 via a further more highly doped semiconductor zone 25. It also suffices, however, to connect the rectifier element to the semiconductor zone 23 in high-impedance fashion, that is to say without the further zone 25.

The rectifier element, only the electrical circuit symbol of which is illustrated in FIG. 6, can be integrated in the semiconductor body 100 in a manner not illustrated more specifically.

Figure 7:
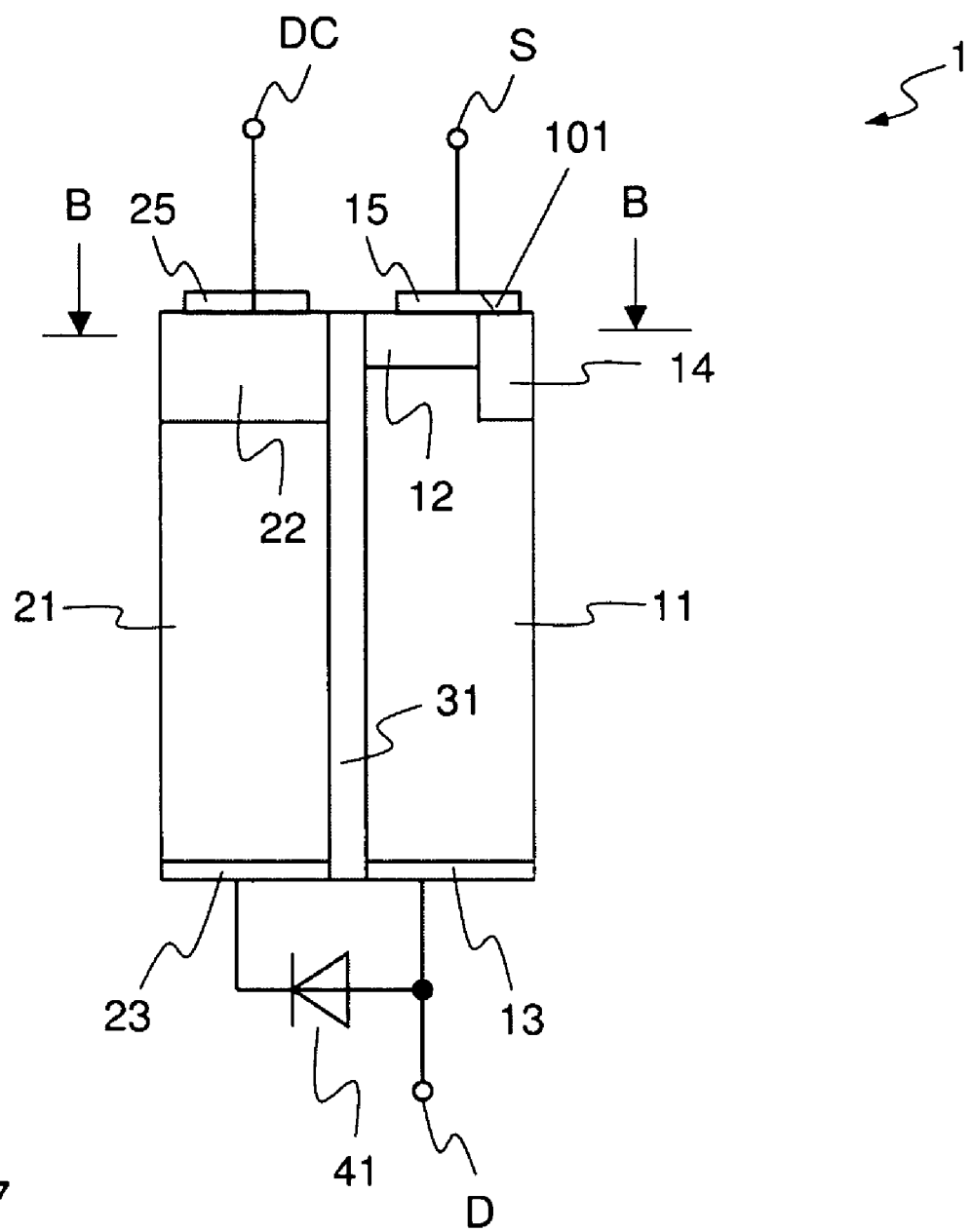
FIG. 7 illustrates one embodiment of a normally on semiconductor component wherein the drift zone is connected to a source terminal using a semiconductor zone doped complementarily with respect to the drift zone.

FIG. 7 illustrates a further example of a normally on semiconductor component. In addition to the component zones explained above with reference to FIG. 1, this component has a semiconductor zone 14 doped complementarily with respect to the source zone 12 and drift zone 11, which semiconductor zone is connected to the source terminal S and extends through the source zone 12 right into the drift zone 11. This semiconductor zone 14 enables an avalanche breakdown of the component. The aim is to permit an avalanche breakdown—if external circuitry of the component constrains such a breakdown—to take place in the drift zone 11. For this purpose, it is necessary to ensure that the breakdown field strength is attained earlier in the drift zone 11 than in the drift control zone 21. This can be achieved e.g., by using the semiconductor zone 14 doped complementarily with respect to the drift zone 11. For this purpose, the semiconductor zone 14 can be doped more highly than the first connection zone 22 adjacent to the drift control zone 21 and/or the semiconductor zone 14 can extend further into the drift zone 11 in the current flow direction than the second connection zone 22 extends into the drift control zone 21. The last-mentioned condition, which is not illustrated in FIG. 7, is tantamount to the semiconductor zone 14 overlapping the drift control zone 21.

Figure 8A:
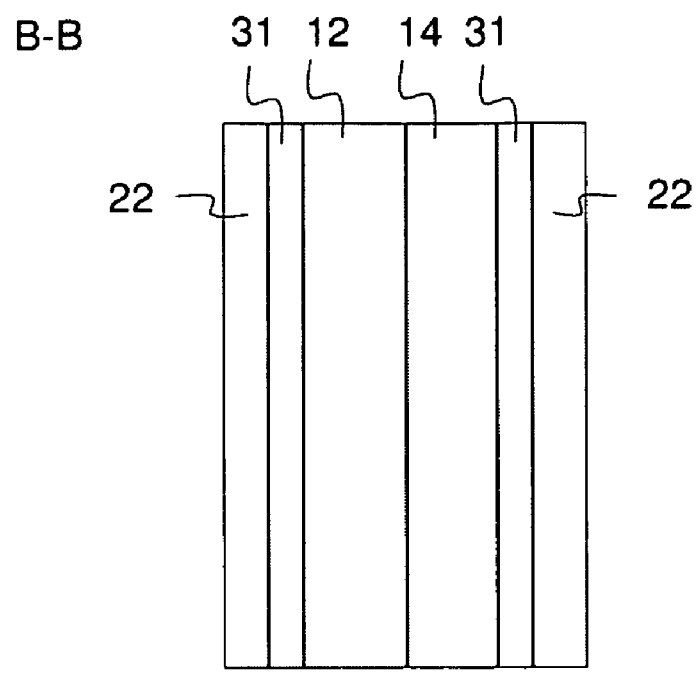
FIG. 8 illustrates different variants of the semiconductor component illustrated in FIG. 7, on the basis of horizontal cross sections through a semiconductor body.
Figure 8B:
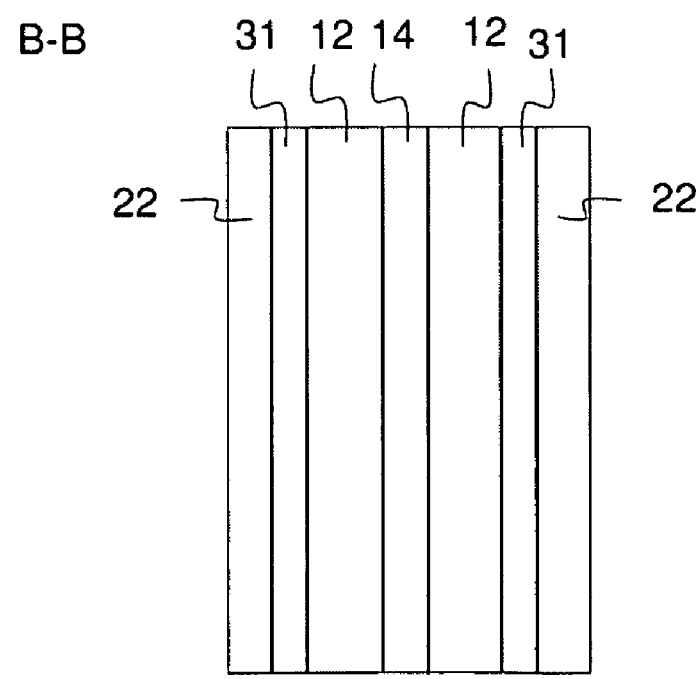

Referring to FIGS. 8A and 8B, which illustrate cross sections through the semiconductor component in accordance with FIG. 7 in a horizontal sectional plane B-B, the complementarily doped semiconductor zone 14 can run parallel to the drift control zone dielectric 31 in the case of strip-type component cells. In this case, the complementarily doped zone 14 can be directly adjacent to one of the two drift control zone dielectrics 31 enclosing the drift zone 11, as is illustrated in FIG. 8A. Referring to FIG. 8B, the complementarily doped zone 14 can also be arranged at a distance from the two drift control zone dielectrics 31.

It goes without saying that the concepts explained with reference to FIGS. 8A and 8B can also be applied to other cell geometries, such as, for example, the hexagonal cells explained with reference to FIG. 3. FIG. 3 likewise illustrates such a complementarily doped semiconductor zone 14 by dashed lines for two of the component cells illustrated there. In one case, the complementarily doped zone 14 adjoins the drift control zone dielectric 31. In the other case, the semiconductor zone 14 is arranged at a distance from the drift control zone dielectric 31.

Figure 9:
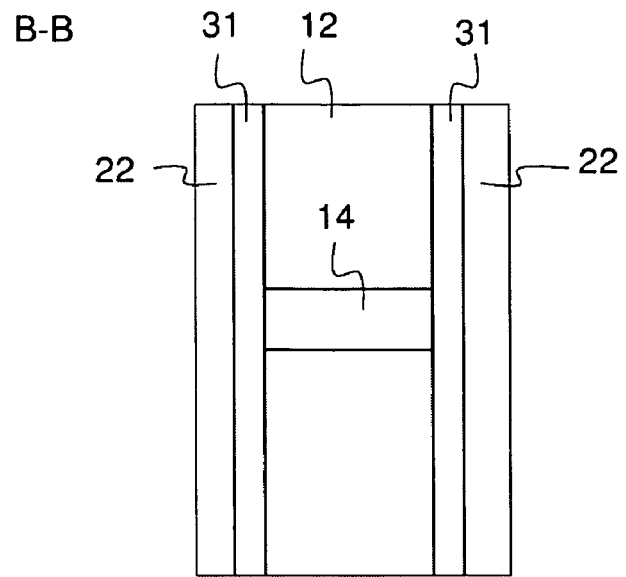
FIG. 9 illustrates one embodiment of a normally on semiconductor component, on the basis of a horizontal cross section through a semiconductor body.

FIG. 9 illustrates a further example. In this example, the complementarily doped zone 14 runs perpendicular to the drift control zone dielectric 31 in a horizontal direction of the semiconductor body.

Figure 10:
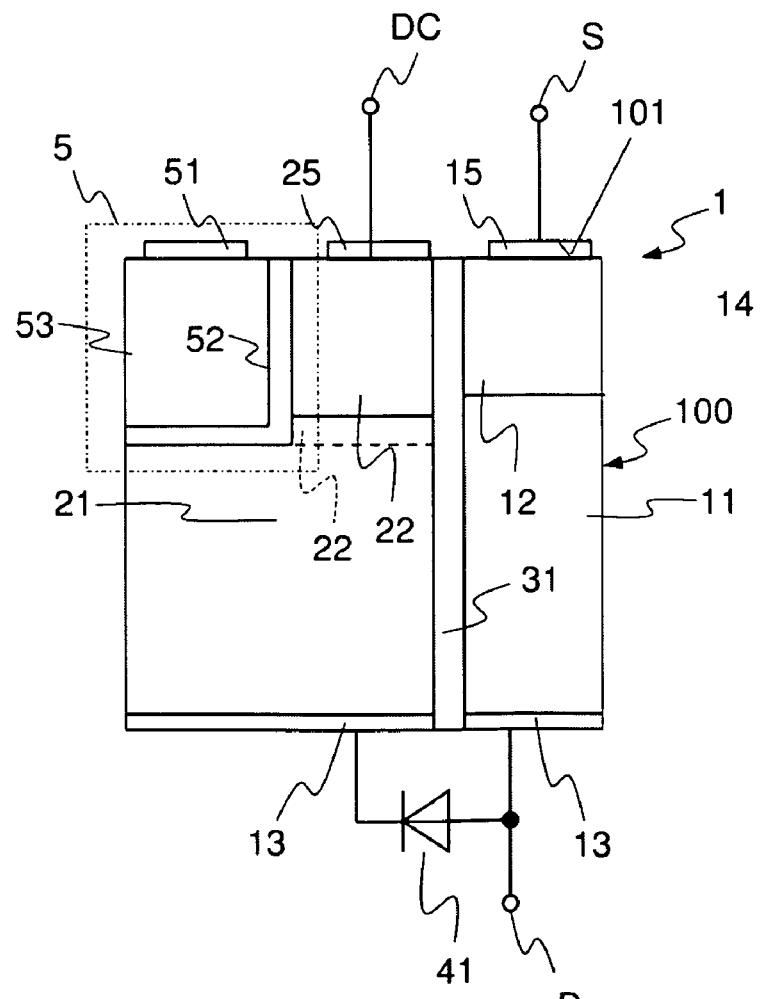
FIG. 10 illustrates one embodiment of a normally on semiconductor component including an integrated capacitance.

FIG. 10 illustrates, on the basis of a vertical cross section through the semiconductor body 100, a normally on semiconductor component 1, in the semiconductor body of which a capacitance 5 is integrated, which capacitance is connected to the drift control zone terminal DC. As explained in connection with FIG. 5, the capacitance 5 serves for buffer-storing electrical charge from the drift control zone 21 when the component is turned off. In the example illustrated, the capacitance 5 includes a capacitance dielectric 52 and also a first capacitance electrode 53, which is connected to a first terminal 51. When the normally on component 1 is used in a circuit arrangement in accordance with FIG. 5, the terminal 51 is connected to a reference potential terminal—in the example in accordance with FIG. 5: the source terminal S of the normally off component 2. In the example illustrated, the first capacitance electrode 53 is arranged adjacent to the drift control zone 21 and the first connection zone 22 and isolated from these component zones by the capacitance dielectric 52. In this example, a second capacitance electrode is formed directly by the drift control zone 21 and the connection zone 22. When the component is turned off, the charge carriers to be stored accumulate along the capacitance dielectric 52 in the drift control zone 21 or the first connection zone 22.

The capacitance dielectric 52 is arranged at a distance from the drift control zone dielectric 31. This prevents the charge carriers that are accumulated along the capacitance dielectric 52 when the component is turned off from influencing the behavior of the component in the off state. In the case of the example illustrated in FIG. 10, part of the capacitance 5 is formed by the control zone 21. In a manner not illustrated in more specific detail, there is also the possibility of realizing the capacitance 5 in such a way that the capacitance dielectric 52 only adjoins the first connection zone 22, that is to say that the capacitance 5 is formed completely within the first connection zone 22. A further example provides for a lower end of the capacitance dielectric 52 to lie at the level of the pn junction between the drift control zone 21 and the first connection zone 22, as is illustrated in dashed fashion in FIG. 10.

Figure 11:
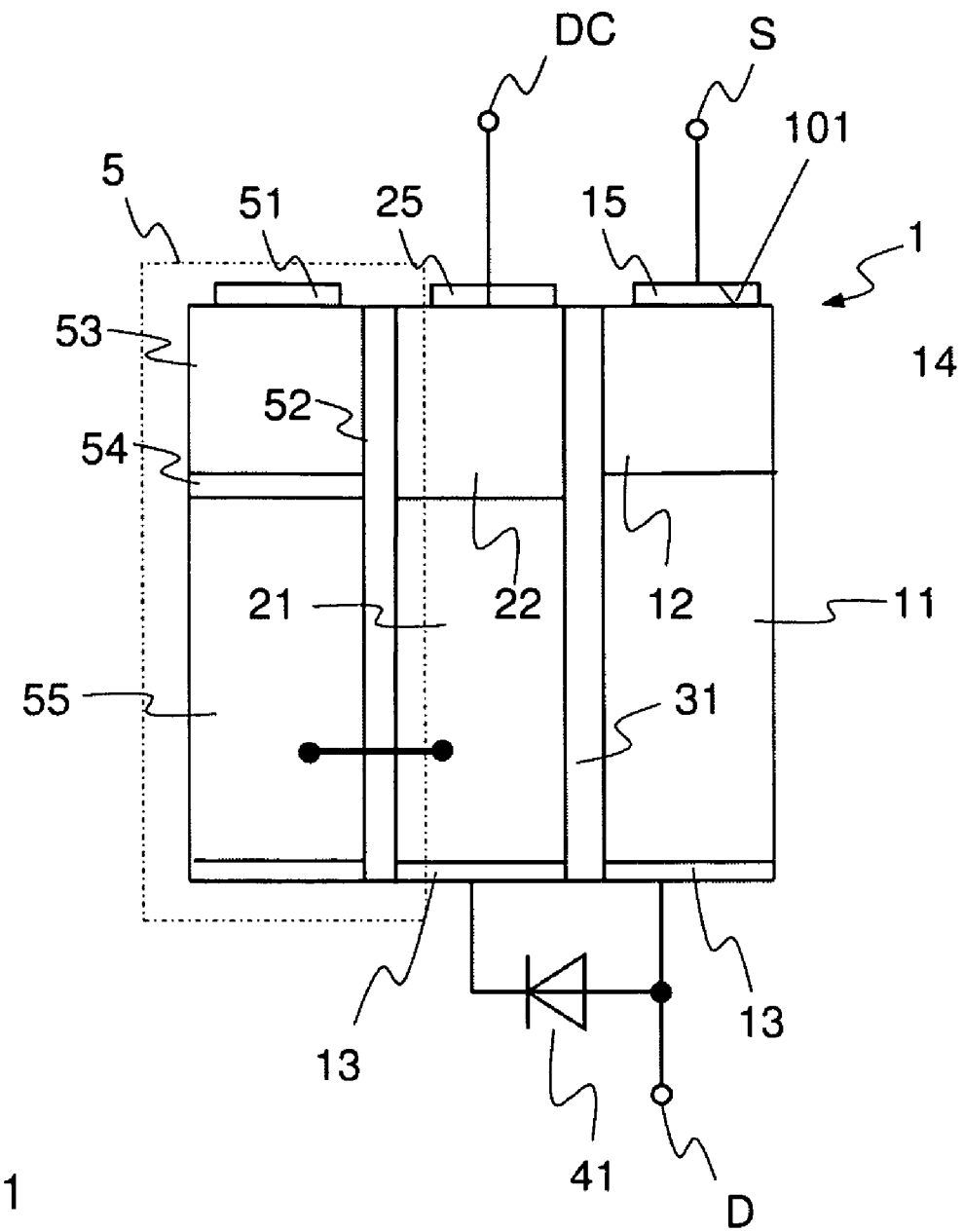
FIG. 11 illustrates one embodiment of a normally on semiconductor component having an integrated capacitance.

FIG. 11 illustrates a further example of a normally on component with an integrated capacitance 5. This component differs from the component illustrated in FIG. 9 in that the capacitance dielectric 52 extends over the entire length of the control zone 21 in the current flow direction of the semiconductor body. In this case, the first capacitance electrode 53 is isolated from the first connection zone 22 by the capacitance dielectric 52. The first capacitance electrode 53 is composed, for example, of a highly doped semiconductor material of the same conduction type as the drift control zone 21. Arranged adjacent to the drift control zone 21 is a semiconductor zone 55, which corresponds to the drift control zone 21, for example, with regard to the doping type and the doping concentration and which is dielectrically insulated from the drift control zone 21 by the capacitance dielectric 52. With respect to the semiconductor zone 55, the first capacitance electrode 53 is realized by a pn junction. The pn junction is formed by a further semiconductor zone 54 doped complementarily with respect to the drift control zone 21. The further semiconductor zone 54 is situated, for example, at the level of the pn junction between the drift control zone 21 and the first connection zone 22 in the current flow direction, such that the first capacitance electrode 53 does not overlap, or at least does not significantly overlap, the drift control zone 21. The semiconductor zone 55 formed below the first capacitance electrode 53 is short-circuited, for example, with the drift control zone 21, which is only illustrated schematically in FIG. 11.

In the case of the component structure illustrated in FIG. 11, the capacitance dielectric 52 can be produced by the same processes as the drift control zone dielectric 31. Furthermore, the drift zone 11, the drift control zone 21 and the semiconductor zone 55 arranged below the first capacitance electrode 53 can be produced by the same production processes. Different processes are necessary only for the production of the source zone 12 above the drift zone 11, the first connection zone 22 above the drift control zone 21 and the first capacitance electrode 53 above the semiconductor zone 55.

Figure 12:
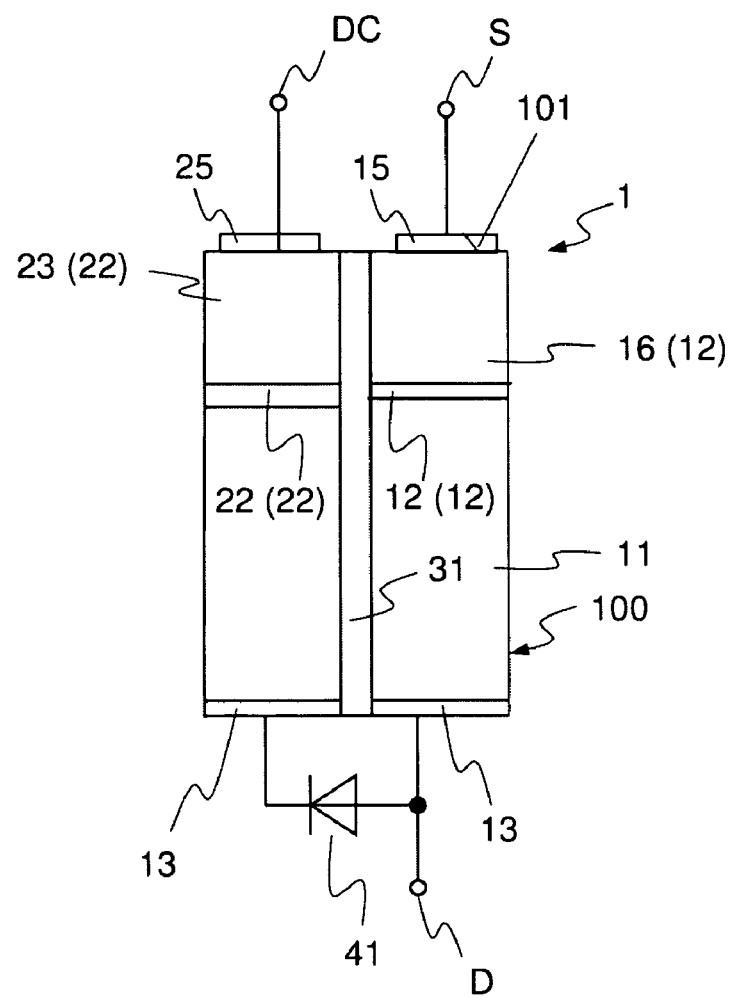
FIG. 12 illustrates one embodiment of a normally on semiconductor component, on the basis of a cross section through a semiconductor body.

In the case of the components explained above, the source zone 12 and the first connection zone 21 in each case extend as far as the front side 101 of the semiconductor body 100. A further example, illustrated in FIG. 12, provides for these component zones to be realized as buried component zones, and for the source zone 12 to be connected to the source terminal 15 or S via a connection zone 16, and for the first connection zone 22 of the drift control zone 21 to be connected to the drift control zone terminal DC via a further connection zone 23. These connection zones 16, 23 can be composed of a highly doped polycrystalline semiconductor material, such as polysilicon, for example, but can also be composed of a metal or a metal-semiconductor compound.

The source zone 12 illustrated in FIG. 12 can be produced in conjunction with a connection zone 16 from a polycrystalline semiconductor material, for example, by dopant atoms being indiffused from the polycrystalline semiconductor material of the connection zone 16 into a monocrystalline section adjacent thereto—which section essentially forms the later drift zone 11. In this case, the source zone 12 is formed by a monocrystalline semiconductor section.

Furthermore, there is also the possibility of producing the source zone 12 and the first connection zone 22 completely from a doped polycrystalline semiconductor material. The polycrystalline semiconductor material forming the first connection zone 22 and the source zone 12 then reaches directly as far as the drift control zone 21 and the drift zone 11, respectively. The reference symbols indicated between parentheses in FIG. 12 relate to this variant.

It should also be noted in this context that the first capacitance electrode 53 of the capacitance 5 (cf. FIGS. 10 and 11) can also be composed of a polycrystalline semiconductor material or of a metal or a metal-semiconductor compound.

Finally, it should be pointed out that features which were explained in connection with just one example above can be combined with features of other examples even if this was not explicitly mentioned. Thus, in particular, features of the claims specified below can be combined with one another as desired.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component, comprising:
    a source zone and a drain zone of a first conduction type and a drift zone of the first conduction type, the drift zone being arranged between the source zone and the drain zone and being doped more weakly than the source zone and the drain zone;
    a drift control zone extending adjacent to the drift zone along the drift zone and having a source-side end and a drain-side end, wherein the source-side end is connected to a drift control zone terminal;
    a drift control zone dielectric arranged between the drift control zone and the drift zone;
    a rectifier arrangement connected between the drift control zone and the drain zone.

2. The semiconductor component of claim 1, wherein the semiconductor component is normally on.

3. The semiconductor component of claim 1, wherein the drift zone and the drift control zone comprise a monocrystalline semiconductor material or an at least approximately monocrystalline semiconductor material.

4. The semiconductor component of claim 1, wherein a connection zone of a second conduction type, which is complementary to the first conduction type, is arranged between the drift control zone terminal and the drift control zone.

5. The semiconductor component of claim 4, wherein the connection zone and the drift zone mutually overlap across the drift control zone dielectric.

6. The semiconductor component of claim 1, further comprising a capacitance connected between the drift control zone and a capacitance terminal.

7. The semiconductor component of claim 4, further comprising a capacitance comprising:
    a first electrode formed by the connection zone;
    a second electrode formed by a doped semiconductor zone; and
    a capacitance dielectric arranged between the connection zone and the doped semiconductor zone.

8. The semiconductor component of claim 7, wherein the second electrode is arranged adjacent to the drift control zone and is also dielectrically insulated from the drift control zone by using the capacitance dielectric.

9. The semiconductor component of claim 8, wherein the second electrode comprises a polycrystalline semiconductor material, a metal or a metal-semiconductor compound.

10. The semiconductor component of claim 1, including a source terminal connected to the source zone.

11. The semiconductor component of claim 10, wherein a source connection zone comprising a polycrystalline semiconductor material, a metal or a metal-semiconductor compound is arranged between the source terminal and the source zone.

12. The semiconductor component of claim 4, wherein a further connection zone comprising a polycrystalline semiconductor material, a metal or a metal-semiconductor compound is arranged between the connection zone and the drift control zone terminal.

13. The semiconductor component of claim 1, wherein the rectifier element is connected to a connection zone of the drift control zone in the region of the drain-side end.

14. The semiconductor component of claim 1, wherein the drift control zone has a lateral end, and wherein the rectifier element is connected to a connection zone of the drift control zone at the lateral end in the region of the source-side end.

15. A semiconductor component arrangement having a normally on semiconductor component, comprising:
- a source zone and a drain zone of a first conduction type and a drift zone of the first conduction type, the drift zone being arranged between the source zone and the drain zone and being doped more weakly than the source zone and the drain zone;
- a drift control zone, which extends adjacent to the drift zone along the drift zone and which has a source-side end and a drain-side end, wherein the source-side end is connected to a drift control zone terminal;
- a drift control zone dielectric arranged between the drift control zone and the drift zone;
- a rectifier arrangement, which is connected between the drift control zone and the drain zone, and having
- a normally off transistor component, comprising a drive terminal and a load path, the load path of which is connected in series with the drift zone of the normally on semiconductor component and the drive terminal of which is coupled to the drift control zone terminal of the normally on semiconductor component.

16. The semiconductor component arrangement of claim 15, wherein the drive terminal of the normally off semiconductor component is coupled to the drift control zone terminal of the normally on semiconductor component via a rectifier element.

17. The semiconductor component arrangement of claim 15, wherein a capacitance is connected between the drift control zone terminal and a first terminal of the load path of the normally off semiconductor component, wherein a second terminal of the normally off semiconductor component is connected to the drift zone of the normally on component and the load path runs between the first and second terminals.

18. The semiconductor component arrangement of claim 15, wherein the normally on semiconductor component and the normally off semiconductor component are integrated in a common semiconductor body.

19. The semiconductor component arrangement as claimed in claim 17, wherein the normally on semiconductor component, the normally off semiconductor component and the capacitance are integrated in a common semiconductor body.

20. The semiconductor component arrangement of claim 17, wherein the normally on semiconductor component, the normally off semiconductor component, the rectifier element and the capacitance are integrated in a common semiconductor body.

* * * * *